(12) United States Patent
Kim

(10) Patent No.: US 7,164,170 B2
(45) Date of Patent: Jan. 16, 2007

(54) RECESS GATE TRANSISTOR STRUCTURE FOR USE IN SEMICONDUCTOR DEVICE AND METHOD THEREOF

(75) Inventor: Ji-Young Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 101 days.

(21) Appl. No.: 10/968,599

(22) Filed: Oct. 18, 2004

(65) Prior Publication Data

US 2005/0087776 A1 Apr. 28, 2005

(30) Foreign Application Priority Data

Oct. 22, 2003 (KR) ............... 10-2003-0073762

(51) Int. Cl.
*H01L 29/76* (2006.01)

(52) U.S. Cl. .................................... 257/330

(58) Field of Classification Search ............... 257/330, 257/331, 332, 369, 900; 438/270, 271, 259, 438/589
See application file for complete search history.

(56) References Cited

U.S. PATENT DOCUMENTS

| 6,251,730 | B1 | 6/2001 | Luo ........................ 438/270 |
| 6,391,720 | B1 * | 5/2002 | Sneelal et al. ............ 438/259 |
| 6,498,071 | B1 | 12/2002 | Hijzen et al. ............... 438/425 |
| 6,521,498 | B1 | 2/2003 | Zandt In't et al. .......... 438/270 |
| 6,939,751 | B1 * | 9/2005 | Zhu et al. .................. 438/151 |
| 7,009,257 | B1 * | 3/2006 | Kim et al. .................. 257/368 |
| 7,012,014 | B1 * | 3/2006 | Lin et al. ................... 438/589 |
| 2002/0196651 | A1 | 12/2002 | Weis ......................... 365/100 |
| 2003/0062568 | A1 | 4/2003 | Beintner ..................... 257/330 |
| 2005/0020086 | A1 * | 1/2005 | Kim et al. .................. 438/700 |
| 2005/0167763 | A1 * | 8/2005 | Kuan et al. ................. 257/396 |
| 2005/0218458 | A1 * | 10/2005 | Kim et al. .................. 257/368 |

* cited by examiner

*Primary Examiner*—Thao X. Le
*Assistant Examiner*—Mursalin B. Hafiz
(74) *Attorney, Agent, or Firm*—Marger Johnson & McCollom, P.C.

(57) ABSTRACT

An inner spacer is formed in a sidewall of a gate in contact with a first active region that is electrically connected to an upper capacitor, thereby reducing a gate induced drain leakage (GIDL). A structure of a recess gate transistor includes a gate insulation layer, a gate electrode, a first gate spacer, a second gate spacer and source/drain regions. The gate insulation layer is formed within a recess. The gate electrode is surrounded by the gate insulation layer and is extended from within the recess. The first gate spacer is spaced with a predetermined distance horizontally with a portion of the gate insulation layer, being formed in a sidewall of the gate electrode. The second gate spacer is formed in another part of the sidewall of the gate electrode. The source/drain regions are formed mutually oppositely on first and second active regions with the gate electrode therebetween.

10 Claims, 7 Drawing Sheets

US 7,164,170 B2

RECESS GATE TRANSISTOR STRUCTURE FOR USE IN SEMICONDUCTOR DEVICE AND METHOD THEREOF

CROSS REFERENCE TO RELATED APPLICATIONS

This application claims priority from Korean Patent Application No. 2003-73762, filed on Oct. 22, 2003, the contents of which are hereby incorporated by reference for all purposes.

BACKGROUND OF THE INVENTION

1. Field of the Invention

This disclosure relates to a MOS transistor, and more particularly, to a recess gate transistor structure for use in a semiconductor device and a method thereof.

2. Description of the Related Art

Techniques for the manufacture and production of semiconductor devices are being developed worldwide, based on requirements of semiconductor users and semiconductor manufacturers. The semiconductor manufacturers are giving an impetus to research and development for enhanced high-speed, miniaturized, highly-integrated, large-capacity semiconductor devices with more stabilized and smooth operation. Thus, designing to integrate more semiconductor devices in a semiconductor chip of limited size reduces an interval between gates, causing a short channel effect, a leakage current, and other difficulties.

In order to solve these shortcomings it is well known in the art of a recess gate type transistor that a gate insulation layer is formed in both side walls and bottom face of a recess formed in a substrate, and then a conductive layer, such as polysilicon, fills the recess, contrary to a planar gate type transistor having a gate electrode formed on a planar substrate. A recess gate transistor forming method according to the related art is described as follows, referring to FIGS. 1 to 4.

FIGS. 1 to 4 are sectional views sequentially illustrating a recess gate transistor forming method according to a related art.

Referring first to FIG. 1, a device isolation film 102, which defines an active region and a non-active region, is formed on a predetermined region of a p-type semiconductor substrate 100. Then a p-type impurity is implanted in the substrate, to thus form a well-region 104. Subsequently, a p-type impurity is ion-implanted into the active region defined by the device isolation film 102, to form a threshold voltage control region 106. Then, an n-type impurity is ion-implanted into the active region, to form an impurity induction layer 108.

Referring to FIG. 2, an oxide layer 110 and a masking layer 112 are formed, then a recess is formed on a portion of the active region through a photolithography process.

With reference to FIG. 3, a gate oxide layer 113 is formed within the recess, and then a polysilicon layer 114 is formed to fill the recess on which the gate oxide layer was formed. Next, a conductive layer 116 and a capping layer 118 are sequentially formed on the polysilicon layer 114.

With reference to FIG. 4, a gate stack is formed through a photolithography process, and an n-type impurity is ion-implanted with relatively low energy into the impurity induction layer 108 by using the gate stack as an ion implantation mask, to thus form an n-type source/drain region of low density. Then, a gate spacer 120 is formed in sidewalls of the gate stack, and impurity is ion-implanted with relatively high energy into the n-type source/drain region of low density by using the gate spacer as an ion implantation mask. That is, an n+ type source/drain region of high density having an impurity density higher than the low density is formed on a portion of the n-type source/drain region that was previously low density. Consequently, the recess gate transistor is obtained according to the related art. According to the related art, a leakage is generated by a concentration of an electric field because only a thin oxide layer is interposed between the active region and the gate. This, in effect, extends the contact region between the active region and the gate. This causes an increased load capacity and gate induced drain leakage (GIDL).

Furthermore, a length of the recess is formed smaller than a length of the gate in order to ensure a misalign margin, and this requires a high-level of precision in the photolithography process and causes a drop in a production yield of the semiconductor device.

Embodiments of the invention address these and other disadvantages of the related art.

SUMMARY OF THE INVENTION

Some embodiments of the invention provide a recess gate transistor structure and method thereof, including forming an inner spacer having a predetermined thickness and depth in a sidewall of a gate that is in contact with a first active region electrically connected to an upper capacitor, so as to reduce a contact region between the first active region and the gate, and to also reduce a load capacity, thereby diminishing a gate induced drain leakage (GIDL). The structure and method also reduce a generation of leakage that is caused by a concentration of an electric field on an edge portion in contact between an upper part of the first active region and the gate by the use of the inner spacer. In addition, the structure and method make the photolithography process easy by ensuring a misalign margin by extending a length of recess longer than a length of the gate without reducing the length of the gate, and preventing a split of the gate by appropriately controlling the length of the recess.

BRIEF DESCRIPTION OF THE DRAWINGS

The above and other features of exemplary embodiments of the invention will become readily apparent from the description that follows, with reference to the attached drawings.

DETAILED DESCRIPTION OF THE INVENTION

The foregoing and other features and advantages of the invention will be apparent from the more particular description of exemplary embodiments of the invention, as illustrated in the accompanying drawings of FIGS. 5 to 14. The invention may be embodied in many different forms and should not be construed as being limited to the exemplary embodiments set forth herein. Rather, these exemplary embodiments are provided so that this disclosure is thorough and complete, and to convey the concept of the invention to those skilled in the art.

A method of forming a recess gate transistor will be described as follows, referring to FIGS. 5 through 14.

Figure 1:
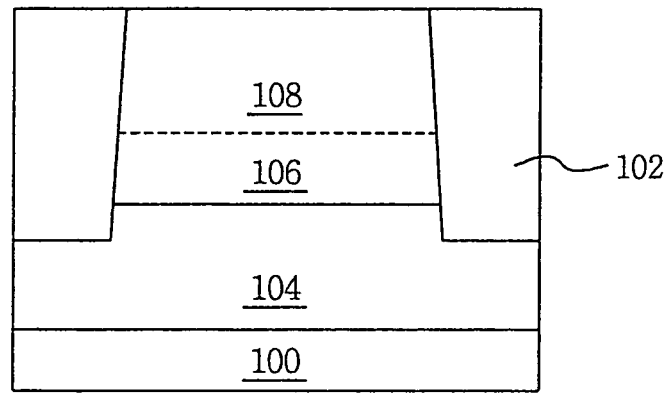
FIGS. 1 to 4 are sectional diagrams sequentially illustrating a recess gate transistor forming method according to a related art.
Figure 2:
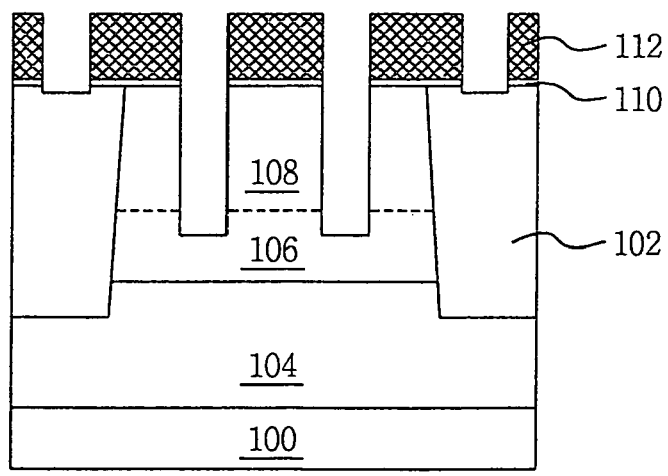
Figure 3:
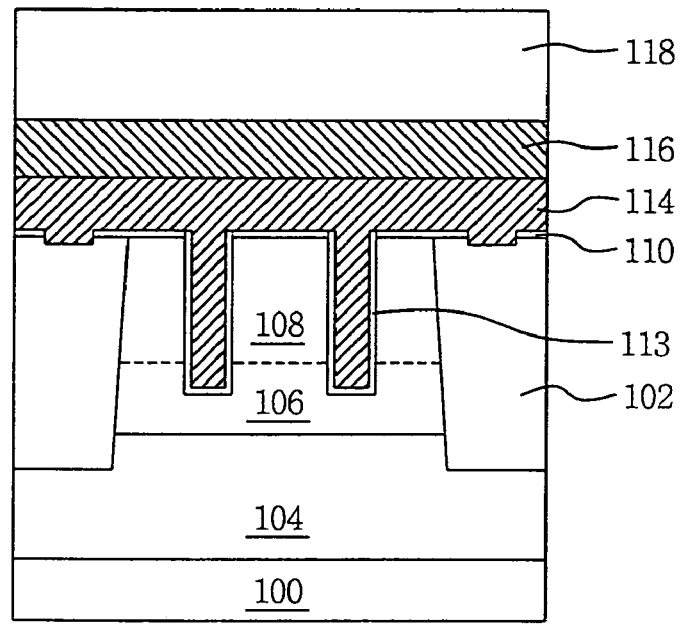
Figure 4:
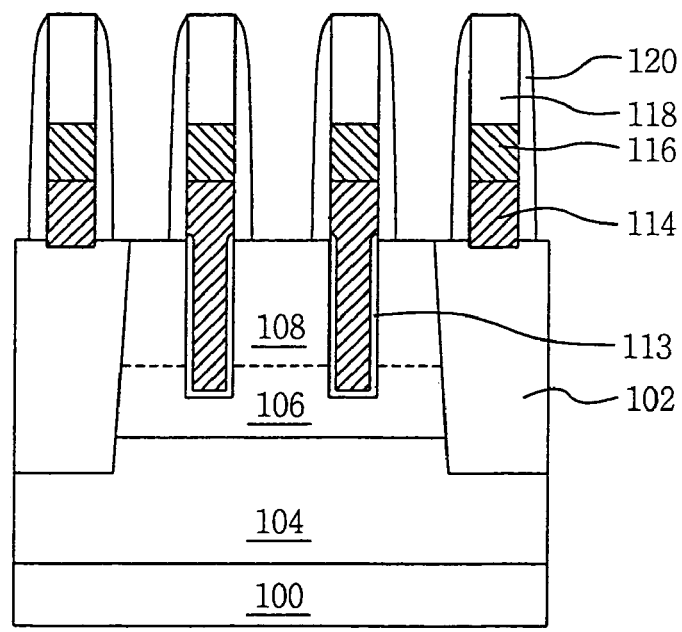
Figure 5:
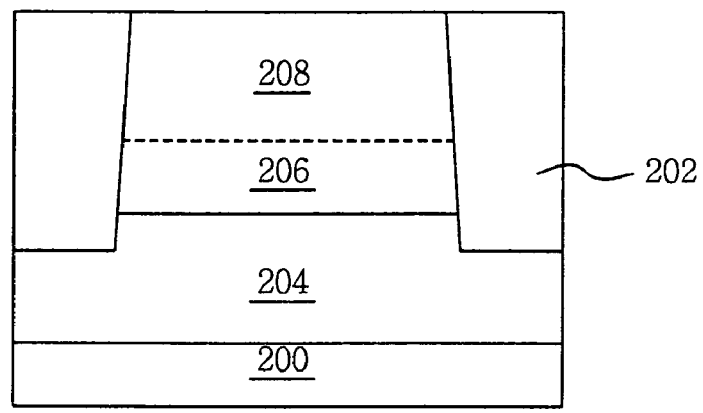
FIGS. 5 and 6, 8 through 11, and FIGS. 13 and 14 are sectional diagrams sequentially illustrating a method of forming a recess gate transistor according to an exemplary embodiment of the invention.

Referring to FIG. 5, a device isolation film 202, which defines an active region and a non-active region, is formed on a predetermined region of a p-type semiconductor substrate 200. A p-type impurity, e.g., Boron, is ion-implanted with an energy of 400 KeV and a density of about $2.0 \times 10^{13}$ ion atoms/cm$^2$ into the surface of the p-type semiconductor substrate 200. Then a thermal process is performed to form a p-type well region 204. The device isolation film 202 is formed by a device isolating method such as a shallow trench isolation (STI) method., and is also formed with any one of an oxide film group that is composed of SOG (Spin On Glass), BPSG (Boron Phosphorus Silicate Glass), PSG (Phosphor Silicate Glass), PE-TEOS (Plasma Enhanced Tetra Ethyl Otho Silicate), USG (Undoped Silicate Glass), and flowable oxide material; or may be formed as a multi-film including more than one from the oxide film group. Furthermore, the device isolation film 202 may be formed with a depth of 2500 Å to 3000 Å, and may also be formed after the formation of the p-type well region.

A threshold voltage control region 206 is formed by ion-implanting a p-type impurity into the active region defined by the device isolation film to control a threshold voltage of the recess gate transistor between 0.8V and 1.5V. For example, B or BF2 is ion-implanted into the active region with an energy of about 40 KeV and a density of about $1.0 \times 10^{13}$ atoms/cm$^2$ to form the threshold voltage control region 206. In this case the threshold voltage control region 206 may be formed with a depth of about 1500 Å to 2000 Å.

Next, an n-type impurity, e.g., P and As, are implanted with an energy of about 15 KeV and a density of $1.0 \times 10^{12}$ to $1.0 \times 10^{13}$ atoms/cm$^2$, by using the device isolation film 202 as an ion implantation mask, to thus form an impurity induction layer 208. The impurity induction layer 208 may be formed with a predetermined depth, e.g., 1000 Å to 1500 Å, and is formed shallower than the threshold voltage control region 206, thereby resulting in a relative increase of a substrate density between the bottoms of a source region and a drain region formed on the impurity induction layer 208 to thus help prevent a short channel effect.

Figure 6:
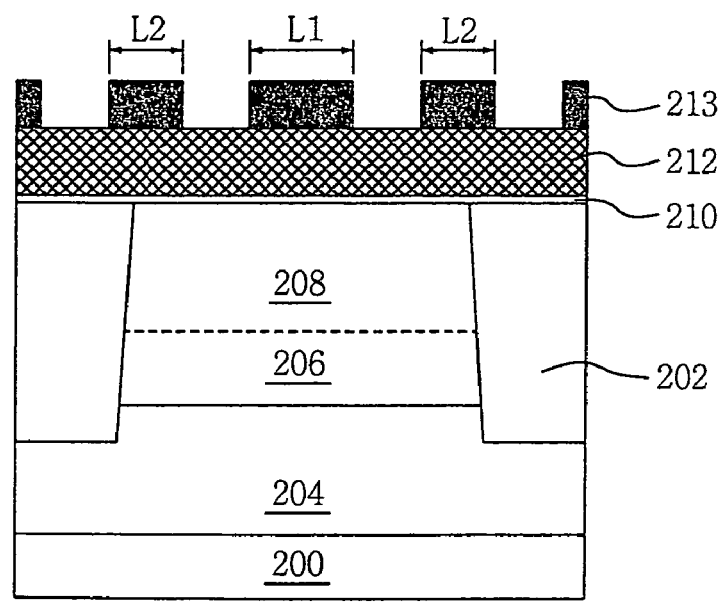

Referring to FIG. 6, an insulation layer 210 and a masking layer 212 are formed on a face of the substrate after the progression in FIG. 5. The insulation layer 210 is formed by a thermal oxide process on the surface of the substrate, and may be formed of an oxide layer made of an MTO (Medium Temperature Oxide) material formed with a temperature of 700° C. to 800° C. The masking layer 212 is formed of polysilicon material and plays a role of an etch mask to form a recess without a misalign within the substrate 200. The insulation layer 210 is formed with a thickness of about 100 Å to 200 Å, and the polysilicon layer 212 may be desirably formed with a thickness of about 1000 Å.

Subsequently, a photolithography process is performed on the masking layer 212, to form a photoresist pattern 213 for exposing a portion where a recess will be formed in the active region. The photoresist pattern 213 is obtained by depositing photoresist on an upper part of the masking layer 212 through a spin coating method employing spinner equipment and then by performing a photolithography process employing a block layer that is provided as an exposure mask for exposing a portion where the gate will be formed and for blocking a portion except the portion where the gate will be formed. In the photoresist pattern 213 an exposed portion thereof is adequately controlled so that a recess having a length of 70 nm to 90 nm is formed, and is then formed in an upper part of the active region and the non-active region. Furthermore the photoresist pattern 213 has a first length L1 of the photoresist for blocking an upper part of the active region. A second length L2 of the photoresist blocks upper parts of the active and non-active regions. A difference between the first length L1 and the second length L2 may be different according to various design rules, but the first length L1 can be formed greater by about 20 nm through 30 nm than the second length L2.

Figure 7:
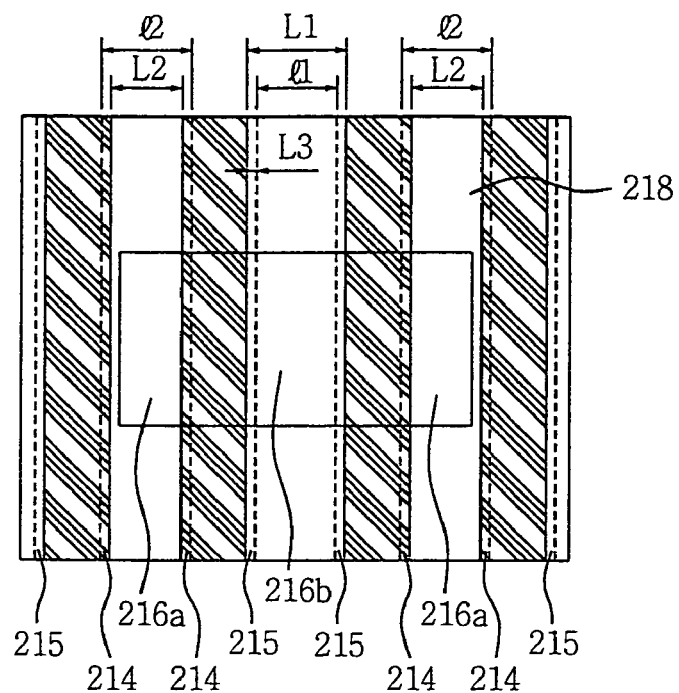
FIG. 7 is a layout illustrating a recess pattern of a recess gate transistor according to some embodiment of the invention.

FIG. 7 compares a layout of a recess pattern for forming a recess gate transistor according to some embodiments of the invention with a layout of recess pattern for forming a recess gate transistor according to the related art.

Referring to FIG. 7, recess patterns 214 are formed vertically along a length and direction of first and second active regions 216a, 216b, surrounded by the non-active region 218, and in parallel with one another. According to the exemplary embodiment of the invention, the first length L1 between the recess patterns 214 is provided greater by a predetermined length of 2×L3 than a length l1 between recess patterns 215 based on the related art. According to these embodiments of the invention, the second length L2 between the recess patterns 214 is provided smaller by a predetermined length of 2×L3 than a length l2 between the recess patterns 215 based on the related art. Thus, the first length L1 between the recess patterns 214 in these embodiments of the invention can be formed greater by the predetermined length of 2×L3, e.g., about 10 nm to 15 nm, as compared with the length l1 between the recess patterns in the related art.

Figure 8:
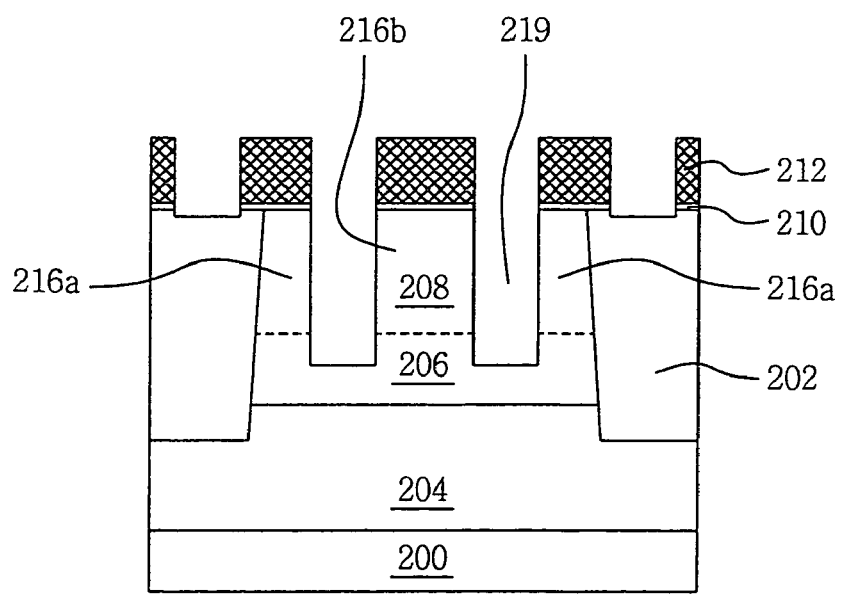

With reference to FIG. 8, the masking layer 212 is etched by using the photoresist pattern 213, then the photoresist pattern 213 is removed through an ashing or strip process. Next, the insulation layer 210 and the substrate are sequentially etched by using the masking layer 212 as an etch mask, to thus form a recess 219 having a predetermined depth in the active region. The recess is formed to separate the first active region 216a, electrically connected to a capacitor, from the second active region 216b, electrically connected to a bit line. The recess 219 can be formed to have a length of about 70 nm to 90 nm and a depth of about 1000 Å to 1500 Å. Then, the masking layer 212 is removed through an etching process.

Figure 9:
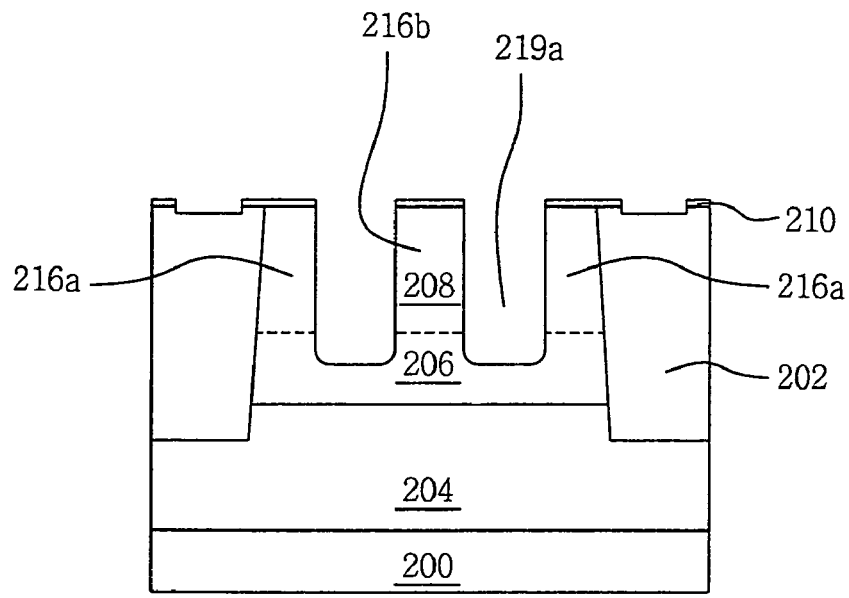

With reference to FIG. 9, side faces of the recess 219 are enlarged by additionally etching a portion that previously was non-etched to produce a slope of the recess. An isotropical etching process, such as CDE or a wet etching process, is also performed within the recess to round-process a corner within the recess 219. This is provided to smoothly perform subsequent processes of forming a conductive material in a portion of the recess and forming an insulation layer spacer in a sidewall of the recess, and to ensure a misalign margin for preventing a misalignment while forming the gate. The sidewall and bottom face of the recess 219 can be etched by a thickness of about 100 Å to 200 Å through an isotropical etching process.

Figure 10:
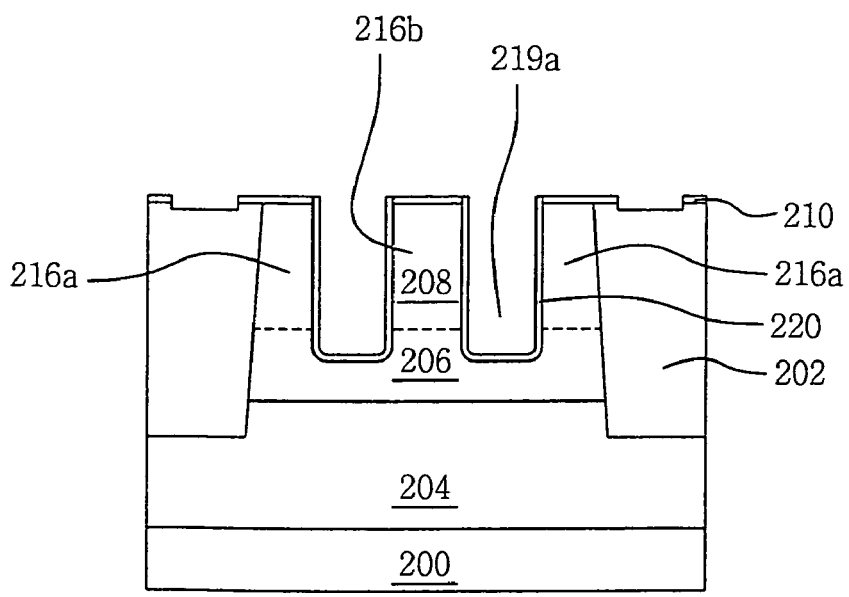

Referring to FIG. 10, a gate insulation layer 220 is formed with a thickness of about 40 Å to 60 Å within the recess 219a. The gate insulation layer 220 is formed of oxide layer material and can be also formed by thermal oxidizing the interior of the recess in dried oxygen in a temperature of 950° C. for abut 20 minutes.

Figure 11:
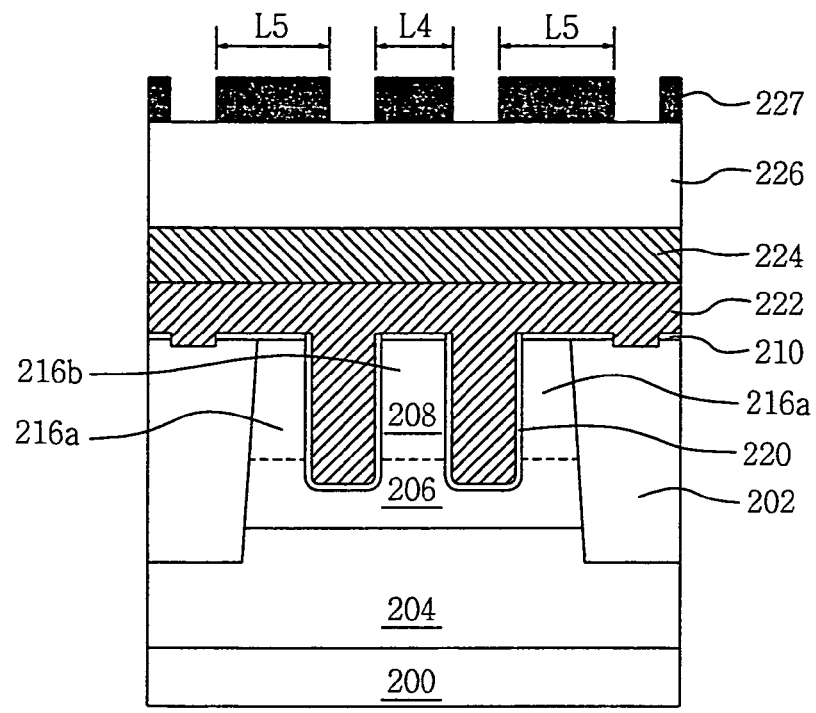

With reference to FIG. 11, a first gate conductive layer 222 is formed enough to fill the recess 219a in which the gate insulation layer 220 was formed. Then a second gate conductive layer 224 and a capping layer 226 are sequentially formed on an upper part of the first gate conductive layer 222. The first gate conductive layer 222 can be formed by a general deposition method such as a chemical vapor deposition (CVD), a low pressure chemical vapor deposition (LPCVD), or a plasma enhanced chemical vapor deposition (PECVD), and can also be formed of polysilicon material. The second gate conductive layer 224 can be formed through a general deposition method, with tungsten (W) as a metal layer, or with a silicide layer of Ti, Ta, W, Ni, Cr, Ir, or Ru. The first and second gate conductive layers 222, 224 provide a gate electrode, and can be formed of a single layer of polysilicon material. Also, the capping layer 226 can be formed of silicon nitride layer material and can be formed through the CVD, LPCVD, PECVD, SACVD (Semi-Atmospheric Chemical Vapor Deposition), sputtering or an atomic layer deposition.

Subsequently, a photolithography process is performed on the capping layer 226, to form a photoresist pattern 227 for exposing a portion where a gate will be formed. The photoresist pattern 227 is obtained by depositing photoresist on an upper part of the capping layer 226 through a spin coating method employing spinner equipment and then by performing a photolithography process employing a block layer that is provided as an exposure mask for exposing a portion where the gate will be formed and for blocking a portion except the portion where the gate will be formed. A portion of the photoresist pattern 227, the gap between lengths L4 and L5, is formed smaller than a length of the recess 219a, and an exposed portion thereof is adequately controlled and formed so that a gate having a length of 70 nm to 90 nm is formed. Furthermore the photoresist pattern 227 has a fourth length L4 of the photoresist for blocking an upper part of the active region. A fifth length L5 of the photoresist blocks upper parts of the active and non-active regions. A difference between the fourth length L4 and the fifth length L5 may become different according to various design rules, but the fourth length L4 can be formed smaller by about 20 nm through 30 nm than the fourth length L4.

Figure 12:
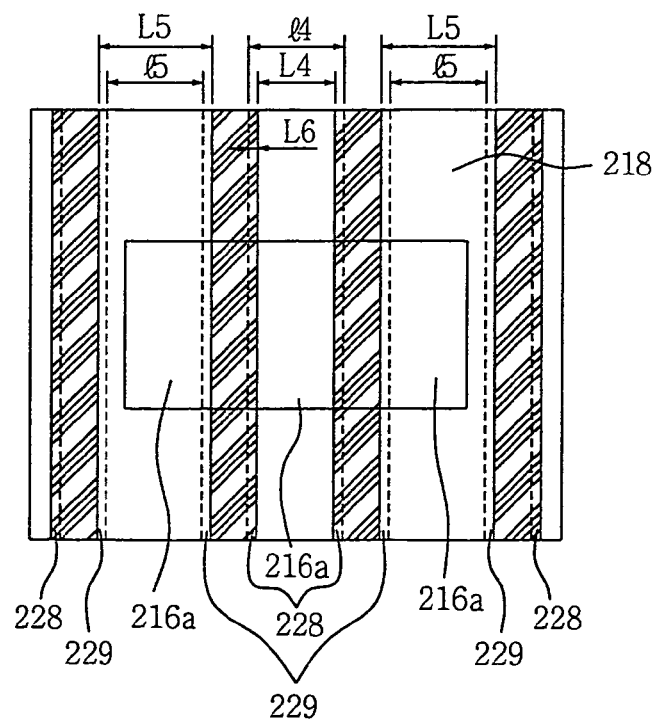
FIG. 12 is a layout illustrating a gate pattern of the recess gate transistor according to some embodiment of the invention.

FIG. 12 compares a layout of a gate pattern for a formation of a recess gate transistor according to an exemplary embodiment of the invention with a layout of gate pattern for a formation of recess gate transistor according to a related art.

Referring to FIG. 12, gate patterns 228 are formed vertically along a length and direction of first and second active regions 216a, 216b, surrounded by the non-active region 218, and in parallel with one another. According to the exemplary embodiment of the invention, the fourth length L4 between the gate patterns 228 is provided smaller by a predetermined length of 2×L6 than a length l4 between gate patterns 229 based on the related art. According to the exemplary embodiment of the invention the fifth length L5 between the gate patterns 228 is provided greater by a predetermined length of 2×L6 than a length l5 between the gate patterns 229 based on the related art. Thus, the fourth length L4 between the gate patterns 228 in the exemplary embodiment of the invention can be formed smaller by the predetermined length of 2×L6, e.g., about 10 nm to 15 nm, than the length l4 between the gate patterns 229 based on the related art.

Figure 13:
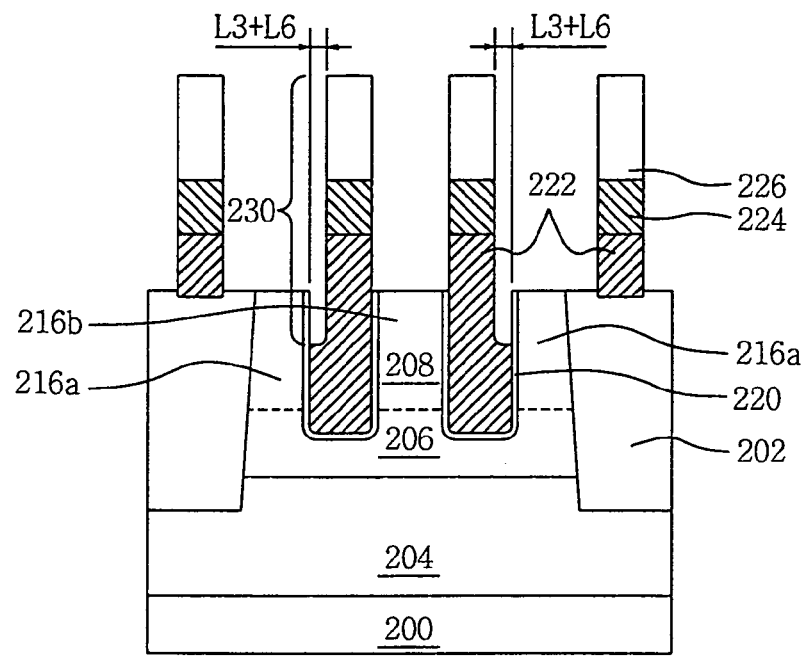

In FIG. 13, the capping layer 226 is etched by using the photoresist pattern 227, and then the first and second gate conductive layers 222, 224 are sequentially etched by using the capping layer 226 as an etch mask, to thus form a gate stack 230. The gate stack 230 is spaced by a predetermined distance of L3+L6 from a portion of the gate insulation layer 220 in contact with the first active region 216a, and is formed in a flute shape having a predetermined depth from an upper surface of the first active region 216a. An upper length of the gate stack 230 is formed less than a lower length thereof, by the predetermined length of L3+L6 distanced from the gate insulation layer 220 that is in contact with the first active region 216a. The flute is formed by ensuring a space determined by moving a predetermined distance of the recess pattern 214 toward the first active region 216a, and by moving a predetermined distance of the gate pattern 228 to a direction of the second active region 216b. For example, the flute is distanced horizontally from a portion of the gate insulation layer 220 in contact with the first active region 216a, by a distance of about 10 nm to 15 nm, and can also be formed to have a depth of about 500 Å to 800 Å from an upper surface of the first active region 216a.

Figure 14:
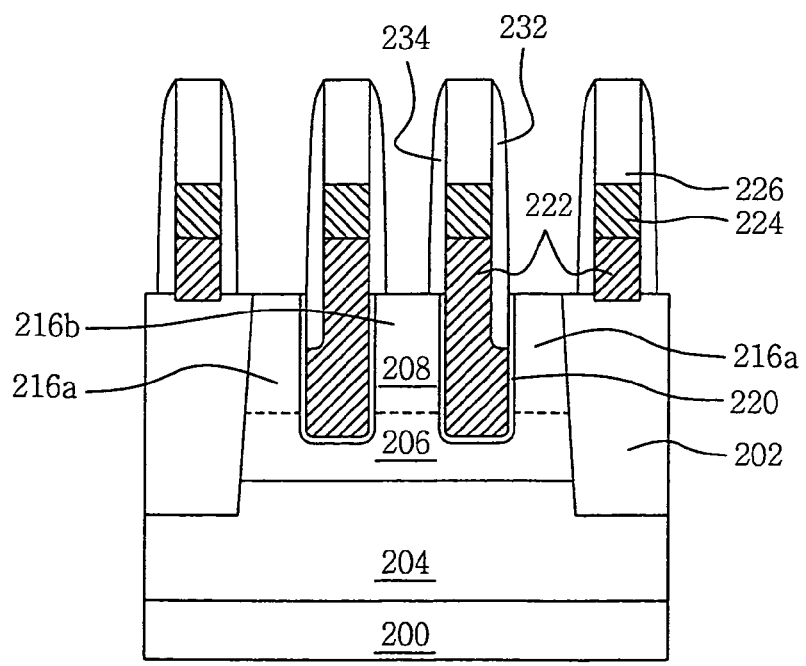

In FIG. 14, to fill the flute, a first gate spacer 232 is formed on a sidewall of the gate stack 230 in contact with the first active region 216a, and a second gate spacer 234 is formed in another sidewall of the gate stack 230 in contact with the second active region 216b. The first and second gate spacers 232, 234, are obtained by forming an insulation layer made of a silicon nitride layer material on an entire face of the substrate having the flute, by CVD, a reflow method, or a deposition method employing high density plasma (HDP) equipment, and then performing an anisotropical etch. This results in a formation of the first gate spacer 232 as an inner spacer, the inner spacer having a length of about 10 nm to 15 nm from the gate insulation layer 220 in contact with the first active region 216a, and having a depth of about 500 Å to 800 Å from an upper surface of the first active region 216a. Also, this results in a formation of the second gate spacer 234 in another sidewall of the gate stack 230 that is in contact with the second active region 216b, only on an upper part of the substrate.

Next, an n-type impurity such as, P and As, is ion-implanted with an energy of 20 KeV to 30 KeV and a density of $1.0 \times 10^{13}$ to $1.0 \times 10^{15}$ atoms/cm$^2$, by using the first and second gate spacers 232, 234 as an ion implantation mask, to form, on a portion of the impurity induction layer 208, an n+ type source/drain region of a high density having an impurity density higher than the impurity induction layer. Thereby the inventive recess gate transistor is obtained according to the exemplary embodiment of the invention.

According to the related art, a leakage is generated by a concentration of an electric field onto an edge portion in contact between an upper part of the active region and the gate, and a load capacity and a gate induced drain leakage (GIDL) are increased by an extension of the region in contact between the active region and the gate. Furthermore, it is difficult to proceed with a photolithography process since a length of the recess is formed smaller than a length of the gate in order to ensure a misalign margin. If a misalignment is generated in forming the gate, a split of the gate results, lowering a production yield of the semiconductor device.

According to an exemplary embodiment of the invention, an inner spacer is formed with a predetermined thickness and depth in a sidewall of the gate in contact with the first active region that is electrically connected to an upper capacitor, whereby reducing a generation of leakage caused by the concentration of an electric field onto an edge portion in contact between an upper part of the first active region and the gate, and also reducing a load capacity by diminishing a region between the first active region and the recess gate, with a reduction of the GIDL.

In addition, according to an exemplary embodiment of the invention, a length of the recess is formed greater than a length of the gate, thereby ensuring a misalign margin without reducing the length of the gate so as to make a photolithography process easy and also preventing a split of the gate by adequately controlling the length of the recess.

Embodiments of the invention may be practiced in many ways. What follows are exemplary, non-limiting descriptions of some of these embodiments.

According to some embodiments of the invention, in a structure of a recess gate transistor formed on a substrate which is defined as an active region and a non-active region by a device isolation film, the active region being sub-defined as a first active region and a second active region by a recess; the structure of the recess gate transistor includes a gate insulation layer, a gate electrode, a first gate spacer, a second gate spacer and source/drain regions.

Herewith, the gate insulation layer is formed with a predetermined thickness within the recess. The gate electrode is surrounded by the gate insulation layer and is extended from within the recess. The first gate spacer is spaced with a predetermined distance horizontally with a portion of the gate insulation layer in contact with the first active region, and is formed in a sidewall of the gate electrode to have a predetermined depth from an upper surface of the first active region. The second gate spacer is formed in a sidewall of the gate electrode in contact with the second active region. The source/drain regions are formed mutually oppositely on the first and second active regions with the gate electrode therebetween.

According to other embodiments of the invention, a method of forming a recess gate transistor on a semiconductor substrate that is defined as an active region and a non-active region by a device isolation film, includes forming a recess for separating first and second active regions in the active region; forming a gate insulation layer within the recess; forming a gate electrode, which is extended from within the recess in which the gate insulation layer was formed, and which has a flute that is spaced with a predetermined distance from a portion of the gate insulation layer in contact with the first active region and that has a predetermined depth from an upper surface of the first active region; forming a first gate spacer in a sidewall of the gate electrode in contact with the first active region, and forming a second gate spacer in a sidewall of the gate electrode in contact with the second active region, so as to fill the flute; and forming source/drain regions formed mutually oppositely on the first and second active regions with the gate electrode therebetween.

The method further includes performing an isotropical etching process within the recess so as to extend a side face of the recess and rounding-process a bottom corner of the recess, after forming the recess.

The formation of the recess includes sequentially forming an insulation layer and a masking layer on an entire face of the substrate on which the device isolation film was formed; forming a photoresist pattern in which a first length of photoresist is greater than a second length of the photoresist, by performing a photolithography process on the masking layer, the first length being for blocking an upper part of the active region and the second length being for blocking upper parts of the active region and the non-active region; etching the masking layer by using the photoresist pattern and then removing the photoresist; sequentially etching the insulation layer and the substrate by using the masking layer as an etch mask; and removing the masking layer.

The formation of the gate electrode includes forming a gate conductive layer within the recess in which the gate insulation layer was formed, and then forming a capping layer on the gate conductive layer; forming a photoresist pattern in which a fourth length of the photoresist is smaller than a fifth length of the photoresist, by performing a photolithography process on the capping layer, the fourth length being for blocking an upper part of the active region and the fifth length being for blocking upper parts of the active region and the non-active region; etching the capping layer by using the photoresist pattern and then removing the photoresist; and etching the gate conductive layer by using the capping layer as an etch mask.

It will be apparent to those skilled in the art that modifications and variations can be made to the exemplary embodiments without deviating from the spirit or scope of the invention. Thus, it is intended that the invention cover any such modifications and variations of this invention provided they come within the scope of the appended claims and their equivalents. For example, a plurality of recess gate transistors connected to the capacitor can be formed so as to form a memory cell. Accordingly, these and other changes and modifications are seen to be within the true spirit and scope of the invention as defined by the appended claims.

The invention claimed is:

1. A recess gate transistor formed on a substrate having a device isolation film that defines an active region and a non-active region, the active region being sub-defined by a recess as a first active region and a second active region, the transistor comprising:
   a gate insulation layer formed with a predetermined thickness within the recess;
   a gate electrode surrounded by the gate insulation layer in a portion that is within the recess, the gate electrode extended from within the recess, the gate electrode having a first sidewall that is partially in contact with the gate insulation layer on the first active region, and having a second sidewall that is partially in contact with the gate insulation layer on the second active region;
   a first gate spacer having a predetermined horizontal thickness measured from a portion of the gate insulation layer in contact with the first active region, and which is formed on the first sidewall to have a predetermined depth from an upper surface of the first active region;
   a second gate spacer formed on the second sidewall, wherein the second gate spacer is disposed on an upper surface of the second active region; and
   a source region and a drain region formed mutually oppositely on the first and second active regions with the gate electrode therebetween.

2. The transistor as in claim 1, wherein the predetermined horizontal thickness is about 10nm to 15nm.

3. The transistor as in claim 1, wherein the predetermined depth is about 500Å to 800Å.

4. The transistor as in claim 1, wherein the first and second gate spacers comprise a silicon nitride layer material.

5. The transistor as in claim 1, wherein the gate insulation layer comprises a silicon oxide layer material and has a thickness of 40Å to 60Å.

6. The transistor as in claim 1, wherein the gate electrode consists of a layer selected from the group consisting of a single layer of polysilicon material and a multilayer having a polycide structure.

7. The transistor as in claim 1, wherein the transistor further comprises a capping layer made of a silicon nitride layer material disposed on an upper part of the gate electrode.

8. The transistor as in claim 1, wherein the source region is disposed on the first active region, and the drain region is disposed on the second active region.

9. A recess gate transistor formed on a substrate having a device isolation film that defines an active region and a non-active region, the active region being sub-defined by a recess as a first active region and a second active region, the transistor comprising:

a gate insulation layer formed within the recess;

a gate electrode, which is extended from within the recess, and an upper length of which is formed smaller than a lower length thereof, by a predetermined distance spaced from the gate insulation layer in contact with the first active region;

a first gate spacer formed on a side face of the gate electrode in contact with the gate insulation layer on the first active region;

a second gate spacer formed on an other side face of the gate electrode in contact with the second active region; and a source region and a drain region formed mutually oppositely on the first and second active regions with the gate electrode therebetween.

10. The transistor as in claim 9, wherein the first gate spacer is formed with a length of 10nm to 15nm and with a depth of 500Å to 800Å measured from an upper surface of the first active region.

* * * * *